United States Patent [19]
Rivoir

[11] Patent Number: 6,098,186
[45] Date of Patent: Aug. 1, 2000

[54] TEST PERMUTATOR

[75] Inventor: Jochen Rivoir, Magstadt, Germany

[73] Assignee: Hewlett-Packard Company, Palo Alto, Calif.

[21] Appl. No.: 09/087,780

[22] Filed: May 29, 1998

[51] Int. Cl.$^7$ .................................................. G01R 31/28
[52] U.S. Cl. ........................... 714/739; 714/735; 714/741
[58] Field of Search .................................. 706/13; 702/84;
708/254; 395/709; 600/510; 714/739, 735, 741

[56]     References Cited

U.S. PATENT DOCUMENTS

| 5,343,554 | 8/1994 | Koza et al. | 706/13 |
| 5,621,665 | 4/1997 | Ghosh et al. | 702/84 |
| 5,737,252 | 4/1998 | Hollmann et al. | 708/254 |
| 5,953,531 | 9/1999 | Megiddo et al. | 395/709 |
| 5,954,662 | 9/1999 | Swanson et al. | 600/510 |

Primary Examiner—Albert De Cady
Assistant Examiner—David Ton

[57]     ABSTRACT

Disclosed is the selecting of permutations of a plurality of parameters, each parameter comprising a plurality of parameter values, for applying the selected permutations as a permutation sequence to a device under test DUT. At first, a cycle size representing the number of parameter values in a parameter cycle to be repeated successively in the permutation sequence is defined for each parameter. The following criteria have to be met: a) the cycle sizes have to be different for all parameter cycles, b) each cycle size has to be equal or greater than the number of different parameter values of the respective parameter, and c) two cycle sizes must not have one or more factors in common. Each parameter cycle is provided with parameter values from that parameter according to the defined cycle size, and the parameter cycles can be repeated concurrently, preferably until a given termination criterion is reached all possible permutations have been selected.

16 Claims, 7 Drawing Sheets

PARAMETER

| PERMUTATION | | A | B | C |
|---|---|---|---|---|
| 1: | | 1 | 3 | 6 |
| | | 2 | 3 | 6 |
| | | 1 | 4 | 6 |
| | | 2 | 4 | 6 |
| | | 1 | 5 | 6 |
| | | 2 | 5 | 6 |
| 7: | | 1 | 3 | 7 |
| | | 2 | 3 | 7 |
| | | 1 | 4 | 7 |
| | | 2 | 4 | 7 |
| | | 1 | 5 | 7 |
| | | 2 | 5 | 7 |
| 13: | | 1 | 3 | 8 |
| | | 2 | 3 | 8 |
| | | . | . | . |
| | | . | . | . |
| | | . | . | . |
| 30: | | 2 | 5 | A |

FIG. 1

PARAMETER

| PERMUTATION | | A | B | C |
|---|---|---|---|---|
| 1 | | 1 | 3 | B |
| | | 2 | 4 | C |
| | | 1 | 5 | D |
| | | 2 | 3 | E |
| 5 | | 1 | 4 | B |
| | | 2 | 5 | C |
| | | 1 | 3 | D |
| | | 2 | 4 | E |
| | | 1 | 5 | B |
| 10 | | 2 | 3 | C |
| | | 1 | 4 | D |
| | | 2 | 5 | E |
| | | 1 | 3 | B |
| | | 2 | 4 | C |
| 15 | | 1 | 5 | D |
| | | 2 | 3 | E |
| | | 1 | 4 | B |
| | | 2 | 5 | C |
| | | 1 | 3 | D |
| 20 | | 2 | 4 | E |
| | | 1 | 5 | B |
| | | 2 | 3 | C |
| | | 1 | 4 | D |
| 24 | | 2 | 5 | E |

FIG.3A

PARAMETER

| | A | B | C |
|---|---|---|---|
| PERMUTATION 1: | 1 | 3 | B |
| | 2 | 4 | C |
| | 1 | 5 | D |
| | 2 | 3 | E |
| | 1 | 4 | B |
| | 2 | 5 | B |
| | 1 | 3 | C |
| | 2 | 4 | D |
| | 1 | 5 | E |
| 10: | 2 | 3 | B |
| | 1 | 4 | B |
| | 2 | 5 | C |
| | 1 | 3 | D |
| | 2 | 4 | E |
| | 1 | 5 | B |
| | 2 | 3 | B |
| | 1 | 4 | C |
| | 2 | 5 | D |
| | 1 | 3 | E |
| 20: | 2 | 4 | B |
| | 1 | 5 | B |
| | 2 | 3 | C |
| | 1 | 4 | D |
| | 2 | 5 | E |
| | 1 | 3 | B |
| | 2 | 4 | B |
| | 1 | 5 | C |
| | 2 | 3 | D |
| | 1 | 4 | E |
| 30: | 2 | 5 | B |

FIG.3B

TEST PERMUTATOR

FIELD OF THE INVENTION

The present invention relates to the selection of permutations of a plurality of parameters, each parameter comprising a plurality of parameter values, for applying the selected permutations as a permutation sequence to a device under test DUT.

BACKGROUND OF THE INVENTION

For testing a device under test (DUT), ideally the DUT has to be exposed to all possible permutations of parameter values that may influence (the testing of) the DUT. In an example for a mechanical device, such parameters could be for example temperature, humidity, or altitude. In case of an electronic device, such as a data processing unit, possible parameters may be the size of a data block transfer in bytes, an alignment of start addresses relative to a cache line size, the number of initial wait cycles, the data direction (read-write), or the occurrence of a data parity error (yes-no).

A known possibility for testing all permutations of parameters is to simply count through all possible permutations. FIG. 1 shows an example with three different parameters A, B and C. Parameter A comprises parameter values 1 and 2, parameter B comprises parameter values 3, 4, and 5, and parameter C comprises the parameter values 6, 7, 8, 9, and A. For applying all possible (2×3×5=30) permutations to the DUT, normally all parameters are varied successively as depicted in FIG. 1. That means that e.g. parameter A is first varied through all possible parameter values of the parameter A, whereas the other parameters B and C remain unchanged at one parameter value, respectively. After all parameter values of the first parameter A have been varied, the next parameter B is varied and the remaining parameter C remains unchanged. Eventually, after all possible permutations of the parameters A and B have been varied, the next, and in this case the last, parameter C will be changed to another parameter value. This will be repeated until all permutations are given.

When a testing cycle comprising a sequence of parameter permutations as shown in FIG. 1 is applied to the DUT, it will take seven successively applied parameter permutations until the parameter C eventually will change its value for the first time. It is easy to see that in case that a large number of parameters is to be varied and/or that each parameter comprises a large number of parameter values, it might take a long time until some of those parameters will be first changed. Furthermore, each test with a specific permutation of parameters takes a certain testing time not including the time to move from one permutation to the next. In case that e.g. 10 parameters (A, B, . . . , J) with each 10 parameter values (1, 2, . . . , 10) have to be tested, and each test will require 1 s, the total testing time will be $10^{10}$ s, which is about 300 years (one year has $3.15 \times 10^7$ s). The last parameter J, however, would first be changed after $10^9$ s, which is after about 30 years. In case a fault happens when the last parameter J has e.g. the parameter value 3, it will almost be impossible to find this fault, since the required testing time is too long.

In case the required testing time for testing all possible permutations is simply too long, a compromise has to be found between a good coverage of possible permutations and the time required therefore. One possibility is to randomly select permutations. Disadvantageous in this solution, however, is that a statement about the actual coverage of the random test cannot be given.

SUMMARY OF THE INVENTION

It is an object of the present invention to provide a sequence of possible permutations of parameters, which allows a good compromise between coverage and required time.

For a better understanding of the invention, some definitions shall be used. A permutation sequence shall represent a number of successive permutations of parameter values. A parameter cycle represents a number of parameter values of one parameter, whereby the parameter cycle is to be repeated successively in the permutation sequence. A cycle size represents the number of parameter values in one parameter cycle.

According to the invention, the cycle sizes in a permutation sequence are selected in a way that the following criteria are met:
- the cycle sizes have to be different for all parameter cycles,
- each cycle size has to be equal or greater than the number of different parameter values of the respective parameter, and
- two cycle sizes must not have one or more (mathematical) factors in common;

Each parameter cycle is provided with parameter values from that parameter according to the selected cycle size. The parameter cycles can be repeated concurrently, preferably until a given termination criterion is reached all possible permutations have been selected, thus providing the permutation sequence, which might be applied to the DUT.

The permutation sequence according to the invention provides an excellent compromise between coverage and required time, since all parameters are varied concurrently.

Further more, all permutation sequence subsets for individual parameters concurrently run from the beginning, so that a coverage of a specific subset might provide a termination criterion. The permutation sequence is independent of the desired coverage, i.e. which (sub-) permutations shall be covered. If multiple (sub-) permutations shall be covered as a termination criterion, they need not be prioritized, because all (sub-) permutations are worked on concurrently, independent of whether their coverage is wanted or not.

Although the selection scheme of the cycle sizes according to the invention might create an additional overhead of repeated permutations in the permutation sequence, it is to be understood that this does not necessarily mean an actual overhead in comparison to a test when applying a permutation sequence according to FIG. 1. In particular in case of a large number of parameters and/or parameter values of the parameters, a full test of all possible permutations will not be possible within a realistic time frame. That means that only a fraction of the total number of permutations will be tested any way, so that the additional 'overhead' of repeated permutations might not be significant.

The permutation sequence according to the invention is preferably used for the generation of test cases by a programmable test-exercising unit in hardware or software simulation.

BRIEF DESCRIPTION OF THE DRAWINGS

Other objects and many of the attendant advantages of the present invention will be readily appreciated and become better understood by reference to the following detailed description when considering in connection with the accompanied drawing in which:

FIG. 1 shows an example of a permutation sequence as known in the art,

FIG. 3A shows an example of a permutation sequence, wherein the criteria for selecting the cycle sizes are not met, FIG. 3B the example of FIG. 3A, wherein the criteria for selecting the cycle sizes are met.

DETAILED DESCRIPTION OF THE INVENTION

Figure 2:
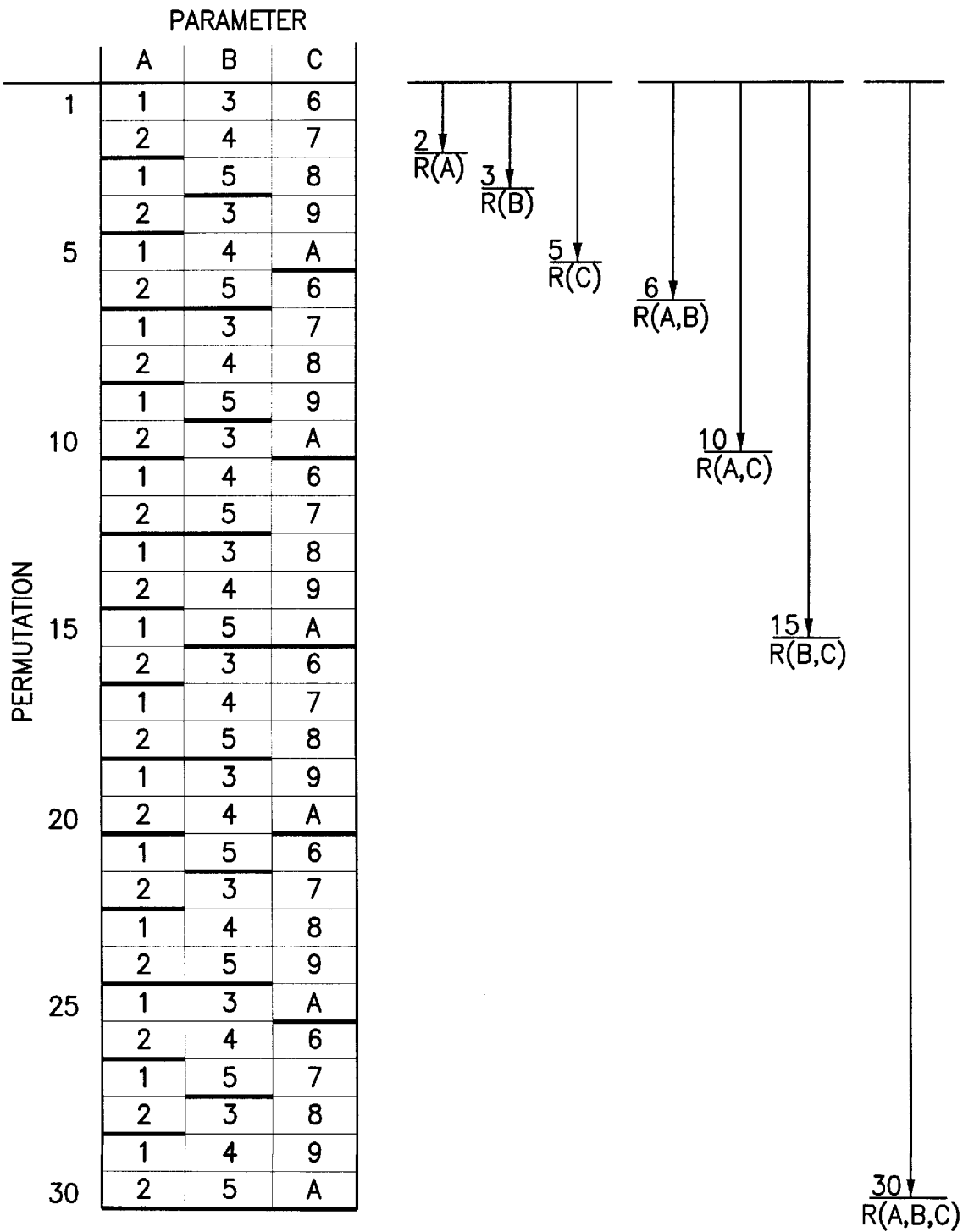
FIG. 2 shows an example of a permutation sequence according to the invention.

FIG. 2 shows an example of a permutation sequence according to the invention. The same parameters and parameter values as used for FIG. 1 are selected. According to the invention, the parameter values of the parameters A, B, and C are varied concurrently, i.e. in parallel. Parameter A has a parameter cycle 1-2 and a cycle size of 2 (cf. R(A)), parameter B has a parameter cycle 3-4-5 and a cycle size of 3 (cf. R(B)), and parameter C has a parameter cycle 6-7-8-9-A and a cycle size of 5 (cf. R(C)). All parameter cycles are repeated concurrently.

As can be seen from FIG. 2, the parameter values of all parameters already change in permutation 2. In permutation 5, or in other words after the parameter cycle with the largest cycle size has been fully applied, each parameter value of each parameter has already been applied once. After permutation 6 (i.e. after 2×3 permutations), all possible (sub-) permutations of the parameters A and B have been varied (cf. R(A, B)). After permutation 10 (i.e. after 2×5 permutations), all possible (sub-) permutations of the parameters A and C have been varied (cf. R(A, C)). Accordingly, after permutation 15 (i.e. after 3×5 permutations), all possible (sub-) permutations of the parameters B and C have been varied (cf. R(B, C)). Eventually, after permutation 30 (i.e. after 2×3×5 permutations), all possible permutations of the parameters A, B, and C have been varied (cf. R(A, B, C)). The total amount of all permutations is again 30 as in FIG. 1.

For the purpose of the invention, the following criteria have to be met for selecting the cycle sizes:

The cycle sizes have to be different for all parameter cycles.

Each cycle size has to be equal or greater than the number of different parameter values of the respective parameter.

Two cycle sizes must not have one or more (mathematical) factors in common.

In order to fulfil those criteria, the parameter cycles might have to be filled up with parameter values from that parameter so that one or more parameter values might be repeated in that parameter cycle.

FIG. 3A shows an example wherein parameter A has two parameter values 1 and 2, parameter B has three parameter values 3, 4, and 5, and parameter C has four parameter values B, C, D, and E. The cycle sizes of parameter cycles are selected according to their numbers of different parameter values. As can be seen from FIG. 3A, permutations 13 to 24 are the same as permutations 1 to 12. In other words, some possible permutations are omitted, while other permutations are duplicated. The reason therefore is that the cycle sizes of the parameter cycles A and C have the factor two in common.

Following the above criteria, either the cycle size of the parameter cycle A or C has to be changed. The next smallest possible cycle size as well for parameter cycle A and C would be five. When the cycle size of parameter cycle A is selected to be five, the number of repetitions in parameter cycle A will be three. However, while the minimum number of permutations is 2×3×4=24, this would lead to a total permutation sequence of 5×3×4=60, meaning an overhead of 60−24=36 permutations occurring twice, i.e. an overhead of 150%. On the other hand, no possible permutations were omitted. In contrast thereto, when the cycle size of parameter cycle C is selected to be five, the number of repetitions in parameter cycle C will be one. In that case, the total number of the permutation sequence will be 2×3×5=30, meaning an overhead of 30−24=36, i.e. an overhead of 25%. FIG. 3B shows the full permutation sequence when the cycle size of parameter cycle C is changed from four to five, whereby the parameter sequence of C consists of B-C-D-E-B.

Figure 4:
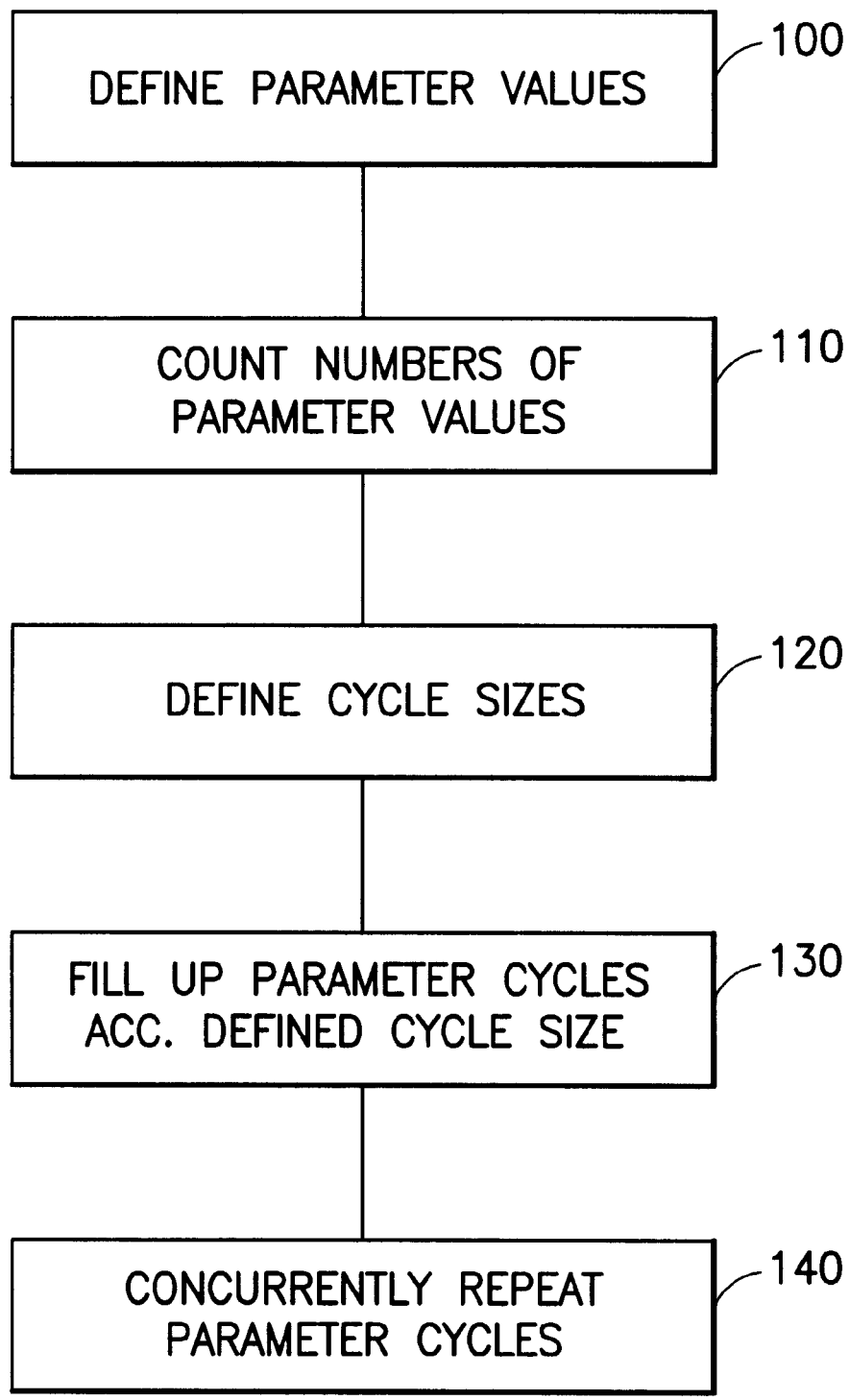
FIG. 4 shows a flow chart of a process to derive a permutation sequence according to the invention.

FIG. 4 shows a flow chart of a process to derive a permutation sequence according to the invention. In a first step 100, all possible parameter values of possible parameters to be applied to the DUT have to be defined. In a step 110, the numbers of different parameter values are counted for each parameter. The actual cycle size for the permutation sequence is defined in a successive step 120 according to the criteria as given above. If required, the parameter cycles are filled up in a step 130 with parameter values of the respective parameter, in accordance with the cycle sizes as defined in step 120. Finally, the parameter cycles can be repeated concurrently in a step 140 e.g. until all possible permutations are given, thus defining the entire permutation sequence, or until a given termination criterion is reached.

A possible termination criterion in step 140 can be, for example, a certain point of time defined e.g. by a pre-given duration of a test, a pre-given coverage of the (entire) permutation sequence, or others. It is also clear that several different criteria can be combined, so that the end of the test is e.g. given when the first termination criterion is met after a certain minimum testing time.

It is to be understood that the permutation sequence according to the invention allows defining a termination criterion in step 140 as a certain coverage of permutations of a subset of parameters. In case that only the permutations of a subset of parameters have to be tested, the termination criterion will be 'terminate after permutation x', whereby x is the product of the cycle sizes of the subset parameters. In the example of FIG. 2 for a subset of the parameters A (with a cycle size of 2) and C (with a cycle size of 5), the termination criterion will be 'terminate after permutation 10' (i.e. after 2×5 permutations). After permutation 10, all possible permutations of the subset of parameters A and C have been applied. Accordingly, when only the permutations of the subset of parameters B (with a cycle size of 3) and C (with a cycle size of 5) have to be tested, the termination criterion will be 'terminate after permutation 15' (i.e. 3×5). After permutation 15, all possible permutations of the subset of parameters B and C have been applied. That is since any subset of parameter permutations starts at permutation 1, so that all subsets of parameter permutations are applied concurrently.

The definition of the cycle sizes in step 120 can be accomplished by selecting the smallest possible cycle sizes, preferably with the least overhead as explained above. This can be done e.g. by repeatedly increasing the cycle sizes, preferably starting from the smallest cycle size, and determining whether the criteria are met. Any possible algorithm as known in the art might be applied for finding the smallest possible cycle sizes.

In a preferred embodiment, step 120 is accomplished by assigning prime numbers to the cycle sizes. Preferably starting from the lowest number of parameter values of one parameter, each cycle size is defined by the next free prime number equal or larger than the number of parameter values for that parameter. That avoids complicated algorithms for defining cycle sizes, however, might lead to a certain overhead.

It is clear that steps 100–140 can be implemented by any kind of general purpose data processing unit as known in the art.

Figure 5A:
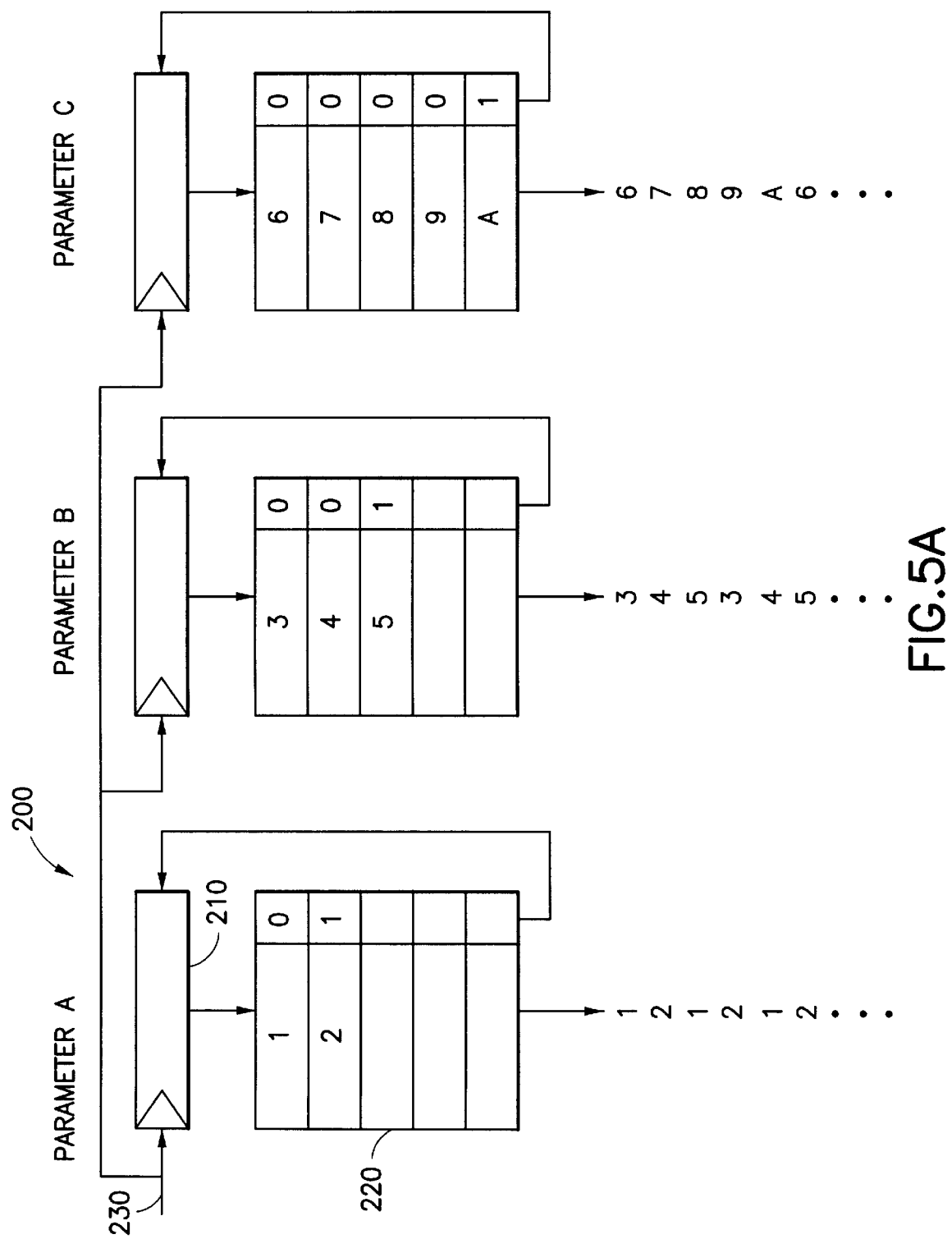
FIGS. 5A and 5B show preferred embodiments for applying the permutation sequence according to the invention to a DUT.

FIG. 5A shows a preferred embodiment for applying the permutation sequence according to the invention to a DUT. A counting unit 200 is assigned to each parameter to be applied to the DUT. Each counting unit 200 comprises a counter 210 coupled to a memory 220. The memory 220 comprises a plurality of data records, each comprising a data word and a loop indication, identified by a specific address. The counter 210 counts successively through all the addresses of the memory 220 starting with the first address. When a loop indicator at a certain address indicates the end of the loop, e.g. a '1', the counter 210 will start again at the first address. Each counting unit 200 is coupled via a line 230 to a (not shown) data processing unit that controls the counting process of each counter 210. The data processing unit can thus initiate or stop each counter 210 either individually or collectively. FIG. 5A shows an embodiment of the example of FIG. 2, whereby a loop indicator '1' indicates the end of the loop.

In another preferred embodiment, the size of the memory 220 is selected to fit the maximum cycle size allowed by the testing system.

Figure 5B:
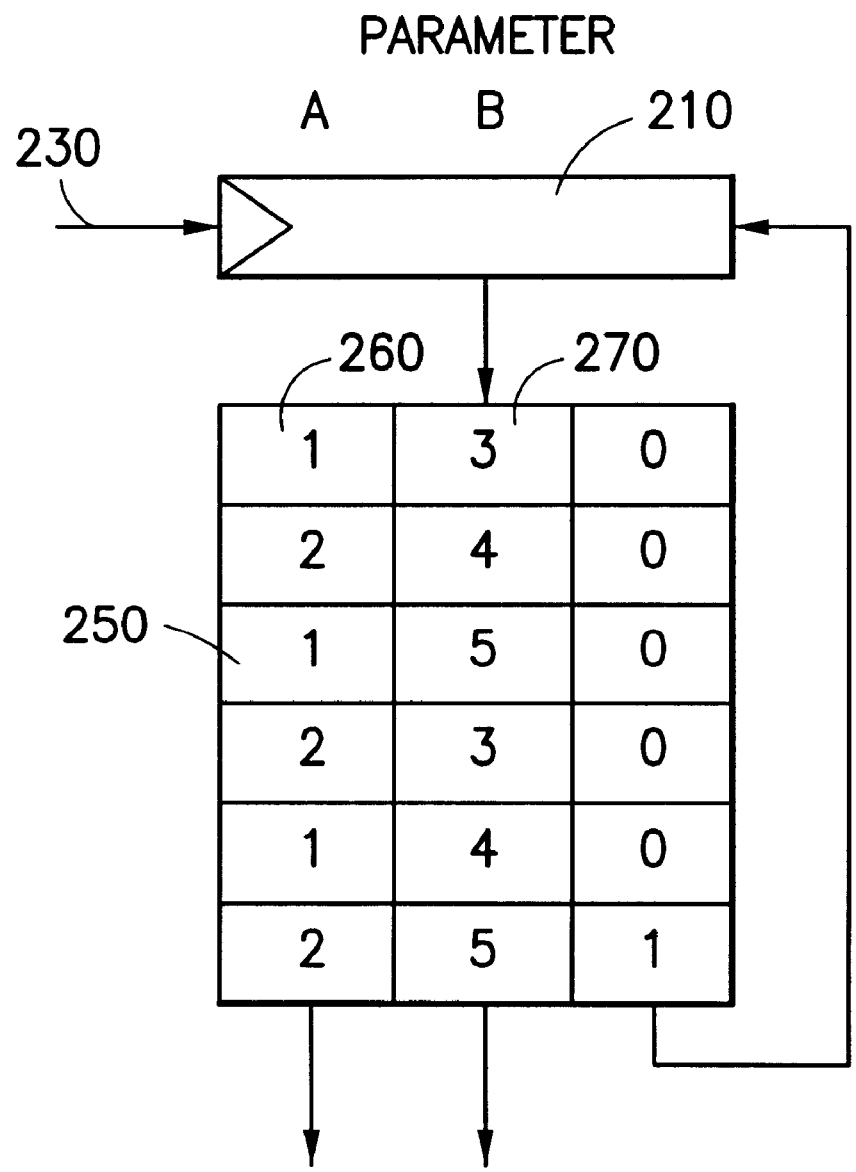

FIG. 5B shows another preferred embodiment for implementing the permutation sequence according to the invention. Instead of providing one counting unit 200 as depicted in FIG. 5A, two or more parameters are combined in one memory 250. The content of memory 250 comprises a repeatable part of the permutation sequence for the respective parameters, starting from the beginning from of the permutation sequence. As shown in FIG. 5B, a column 260 comprises three successive parameter cycles for parameter A and a column 270 comprises two successive parameter cycles of parameter B, thus providing a complete permutation sequence of the subset of parameters A and B. The minimum size of column 260 and 270 is defined by the product of the cycle sizes of parameters A and B.

It is clear that the embodiments of FIG. 5A and 5B can be combined and that the embodiment of FIG. 5B is not limited to two parameters but can be applied to any number of parameters.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for selecting permutations of a plurality of parameters, each parameter comprising a plurality of parameter values, for applying the selected permutations as a permutation sequence to a device under test DUT, the method comprising the steps of:

a) defining, for each parameter, a cycle size representing the number of parameter values in a parameter cycle to be repeated successively in the permutation sequence, whereby the following criteria have to be met:

a1) the cycle sizes have to be different for all parameter cycles, a2) each cycle size has to be equal or greater than the number of different parameter values of the respective parameter, and a2) two cycle sizes must not have one or more factors in common;

b) providing each parameter cycle with parameter values from that parameter according to the cycle size as defined in step (a); and c) concurrently repeating the parameter cycles.

2. The method of claim 1, wherein step c) is executed until a termination criterion is reached.

3. The method of claim 2, wherein the termination criterion is a certain point in time, preferably after a pre-given duration of a test.

4. The method of claim 2, wherein the termination criterion is a pre-given coverage of the permutation sequence or a subset thereof.

5. The method of claim 1, wherein step a) comprises a step of selecting the smallest possible cycle sizes, preferably with the least overhead.

6. The method of claim 5, wherein the step of selecting the smallest possible cycle sizes, comprises a step of repeatedly increasing the cycle sizes and determining whether the criteria are met.

7. The method of claim 6, wherein the step of repeatedly increasing the cycle sizes is started from the smallest cycle size.

8. The method of claim 1, wherein step a) comprises a step of assigning prime numbers to one or more cycle sizes.

9. The method of claim 8, wherein the step of assigning prime numbers comprises a step of defining a respective cycle size as the next free prime number equal or larger than the number of parameter values for that parameter.

10. The method of claim 9, wherein the step of defining a respective cycle size as the next free prime number is executed starting from the lowest number of parameter values of one parameter.

11. A system for selecting permutations of a plurality of parameters, each parameter comprising a plurality of parameter values, for applying the selected permutations as a permutation sequence to a device under test DUT, the system comprising:

means for defining a cycle size for each parameter, the cycle size representing the number of parameter values in a parameter cycle to be repeated successively in the permutation sequence, whereby the following criteria for defining a cycle size have to be met:

the cycle sizes have to be different for all parameter cycles, each cycle size has to be equal or greater than the number of different parameter values of the respective parameter, and two cycle sizes must not have one or more factors in common;

means for providing each parameter cycle with parameter values from that parameter according to the defined cycle size; and means for concurrently repeating the parameter cycles.

12. The system of claim 11, further comprising means for terminating the concurrently repeating the parameter cycles.

13. The system of claim 11, wherein the means for concurrently repeating the parameter cycles comprises a counting unit with a counter coupled to a memory.

14. The system of claim 13, wherein the memory comprises a plurality of data records, each being identified by a specific address and comprising a data word and a loop indication.

15. The system of claim 13, wherein the memory comprises a repeatable part of the permutation sequence for one or more parameters.

16. The system of claim 13, wherein the system comprises the means for concurrently repeating the parameter cycles for each one of the parameters.

* * * * *